United States Patent [19]
Michaud et al.

[11] Patent Number: 5,954,886
[45] Date of Patent: Sep. 21, 1999

[54] CLEANING AGENT BASED ON CYCLOALKANES

[75] Inventors: Pascal Michaud, Saint-Gratian; Jean-Jacques Martin, Bois-Colombes, both of France

[73] Assignee: ELF Atochem S.A., Paris, France

[21] Appl. No.: 08/945,079

[22] PCT Filed: Apr. 17, 1996

[86] PCT No.: PCT/FR96/00584

§ 371 Date: Feb. 10, 1998

§ 102(e) Date: Feb. 10, 1998

[87] PCT Pub. No.: WO96/33260

PCT Pub. Date: Oct. 24, 1996

[30] Foreign Application Priority Data

Apr. 20, 1995 [FR] France ................................. 95 04727

[51] Int. Cl.⁶ ............................. B08B 3/04; B08B 3/08; C23G 5/02; C23G 5/024
[52] U.S. Cl. .................. 134/2; 134/40; 134/42; 510/175; 510/245; 510/365; 510/407
[58] Field of Search .................. 134/40, 2, 42; 510/175, 245, 365, 407

[56] References Cited

U.S. PATENT DOCUMENTS 5,399,282  3/1995  Hansen et al. .......................... 252/162

FOREIGN PATENT DOCUMENTS

| | | |
|---|---|---|
| 2255871 | 2/1988 | European Pat. Off. . |
| A2 354 027 | 2/1990 | European Pat. Off. . |
| 474 053 A1 | 3/1992 | European Pat. Off. . |
| 0 529 869 | 3/1993 | European Pat. Off. . |
| 3316988 | 11/1984 | Germany . |
| 2 175 004 | 11/1986 | United Kingdom . |
| 2 266 725 | 11/1993 | United Kingdom . |
| WO91/19831 | 12/1991 | WIPO . |
| WO 93/06204 | 4/1993 | WIPO . |
| WO93/13246 | 7/1993 | WIPO . |
| WO 95/10593 | 4/1995 | WIPO . |

OTHER PUBLICATIONS

Chemical abstracts, vol. 115, No. 16, abstract No. 161650, p. 137, Oct. 21, 1991 (JP A 03 062 896).

Database WPI, JP A 01 132 694 (abstract) May 25, 1989.

Database WPI, JP A 062 79 786 (abstract) Oct. 4, 1994.

*Primary Examiner*—Zeinab El-Arini
*Attorney, Agent, or Firm*—Millen, White, Zelano & Branigan, P.C.

[57] ABSTRACT

The use of a mixture of cycloalkanes of general formula $C_nH_2(n+1-a)$ in which n is an integer ranging from 8 to 12 and a represents the number of rings as agent for cleaning and degreasing solid surfaces, e.g., printed circuits. The mixture has a flash point above 55° C. (ASTM D56-70) and a distillation range of 175° C. to 235° C.

16 Claims, No Drawings

5,954,886

CLEANING AGENT BASED ON CYCLOALKANES

This is a national stage application of PCT/FR96/00584 filed Apr. 17, 1996.

FIELD OF THE INVENTION

The present invention relates to cycloalkanes which can be used as cleaning and degreasing agents, in a machine and in a non-aqueous medium, of solid surfaces such as metal components, ceramics, glass and plastics which have been soiled by machine oils or greases and/or oils or greases for their temporary protection.

These cycloalkanes can also be used for defluxing printed circuits. This defluxing operation consists in removing the welding flux.

BACKGROUND OF THE INVENTION

Hitherto, hydrocarbon solvents were used for these various operations and mainly chlorinated solvents such as, in particular, 1,1,1-trichloroethane, known in the art by the name T 111, as well as chlorofluoroalkanes such as 1,1,2-trichloro-1,2,2-trifluoroethane, known in the art by the name F 113.

However, these chloro and fluorochloro compounds are suspected of being responsible for the decrease in the stratospheric ozone layer which provides protection against certain radiations.

Following the Montreal Protocol which results from recent international discussions on the environment, these chloro or fluorochloro compounds will before long need to be replaced by substitutes having little or no destructive effect with respect to stratospheric ozone.

British patent application GB 2,175,004 proposes a cleaning composition for removing greases from metal or plastic surfaces, comprising from 85 to 97 parts by weight of non-aromatic hydrocarbons containing aliphatic and/or cycloaliphatic compounds and from 3 to 15 parts by weight of aromatic compounds containing at least one alkyl group having from 8 to 18 carbon atoms.

However, this composition has the drawback of containing non-negligible amounts of aromatic compounds.

On account, in particular, of their relatively irritant nature, the use of such compounds in degreasing applications is seen to be increasingly limited, or even prohibited.

Application WO 91/19831 describes a composition comprising cycloparaffins, branched paraffins and at least one surfactant.

European patent application EP 0,474,053 describes, in Example 1 thereof, a composition consisting of:
69% by weight of cycloparaffins,
29% by weight of isoparaffins,
2% by weight of n-paraffins,
and traces of aromatic compounds.

Application WO 93/06204 relates to a composition consisting essentially of:
1) 30 to 70% by volume of a glycol ether,
2) 30 to 70% by volume of one or more linear, branched or cyclic aliphatic hydrocarbons having from 12 to 18 carbon atoms,
3) from 0 to 10% by volume of at least one surfactant, and
4) from 0 to 5% by volume of at least one inhibitor, fragrance or dye.

Application WO 93/13246 relates to a composition comprising:
i) from 75 to 90 parts by volume of a distillation fraction obtained by distillation of petroleum, the said fraction containing not less than 92% by weight, based on the total weight of the fraction, of hydrocarbons chosen from naphthenic and paraffinic hydrocarbons having from 8 to 15 atoms, and
ii) 5 to 25 parts by volume of one or more branched or unbranched saturated aliphatic alcohols having from 5 to 15 carbon atoms.

Chemical Abstracts, Vol. 115, No. 16, No. 161650 relating to JP-A-03062896, describes a cleaning composition containing at least 70% by weight of a saturated cyclic hydrocarbon having from 9 to 18 carbon atoms, and 0.1 to 30% by weight of an aliphatic alcohol having from 6 to 18 carbon atoms and/or a nonionic surfactant.

SUMMARY OF THE INVENTION

It has now been found that a practically pure cycloalkane or a mixture of cycloalkanes having a flashpoint above 55° C., measured according to ASTM standard D56-70, and a distillation range of from 175° C. to 235° C. could be used as an agent for cleaning and degreasing solid surfaces.

In the present case, the expression mixture of cycloalkanes denotes a mixture of saturated mono- or polycyclic hydrocarbons, optionally substituted with one or more alkyl residues, of general formula $C_nH_2(n+1-a)$ (I) in which n is an integer ranging from 5 to 26 and a represents the number of rings.

According to the present invention, a mixture of cycloalkanes of formula (I) in which n is an integer ranging from 8 to 12, and preferably ranging from 9 to 11, and a is an integer ranging from 1 to 5, and preferably ranging from 1 to 3, will preferably be used.

By way of illustration of such mixtures which can be used according to the present invention, mention may be made of the mixtures of (alkyl)cycloalkanes obtained by catalytic hydrogenation of petroleum fractions consisting of aromatic and/or cyclodienic compounds such as, in particular, alkylbenzenes, divinylbenzenes, dicyclopentadiene, alkyldicyclopentadienes, and naphthalene and its alkylated derivatives.

The mixtures of (alkyl)cycloalkanes thus obtained essentially consist of saturated cyclic hydrocarbons which may have one or more alkyl residues having from 1 to 4 carbon atoms.

Illustrations of such mixtures which may be mentioned are mixtures containing two or more of the following compounds: tetrahydrodicyclopentadienes, methyltetrahydrodicyclopentadienes, dimethyltetrahydrodicyclopentadienes, ethylpropylcyclohexanes, alkyldecahydronaphthalenes.

According to the present invention, mixtures containing at least 40% by weight of endo-tetrahydrodicyclopentadiene will preferably be used.

According to the present invention, petroleum fractions referred to as naphthenic fractions may also be used as the mixture of cycloalkanes.

These naphthenic fractions essentially consist of compounds of formula (I) in which a=1, 2 or 3 and n is generally between 9 and 12.

Examples of such naphthenic fractions which may be mentioned are the naphthenic solvents sold by Exxon Chemical under the name Nappar 11.

Examples of practically pure cycloalkanes which may be mentioned are cyclodecane, tricyclo[6.2.10.$^{2,6}$] decane and bicyclohexyl.

The mixture of cycloalkanes according to the present invention has the advantage of having flashpoints above 55° C., which allows it to be used without danger in machines in which so-called A3 solvents are used, that is to say solvents whose flashpoint is between 55° C. and 100° C.

Accordingly, the mixture of cycloalkanes of the present invention may be used most particularly in so-called closed systems in which the temperatures may reach 40° C., or even higher, in order to clean solid surfaces such as metal and/or plastic components and in order to deflux printed circuits.

The mixture of cycloalkanes of the present invention may be stabilized.

Stabilizing agents which may be used are nitro derivatives such as nitromethane, nitroethane, nitropropane and nitrotoluene; ethers or acetals such as dimethoxymethane, 1,3-dioxolane and dimethoxyethane; amines such as triethylamine, dipropylamine and dimethylamine; phosphorus derivatives such as triisodecyl phosphite and triisooctyl phosphite.

The mixture of cycloalkanes may also contain one or more odour-masking agents.

Examples of such products which may be mentioned are vanillin and its derivatives, and essences of pine.

These compounds are used in very low amounts, generally between 0.01 and 0.1 part by weight per 100 parts by weight of the mixture of cycloalkanes.

The mixture according to the invention has the advantage of being readily removed after the degreasing operation.

The examples which follow illustrate the invention.

In these examples, the flashpoints are determined according to ASTM standard D56-70.

The following compounds were used:

"Nappar 11" naphthenes (referred to hereinbelow as Nap 11). This cycloalkane fraction has a distillation range of from 182° C. to 200° C. and a flashpoint of 60° C.

A mixture of cycloalkanes containing about 40% by weight of endo-tetrahydrodicyclopentadiene (referred to hereinbelow as THDCPD) having a distillation range of from 180° C. to 210° C. and a flashpoint of 58° C.

EXAMPLE 1

A 40×30 mm stainless steel grille is weighed after coating with a whole oil or water-soluble oil supplied by Castrol, Shell, Mobil or Elf, and is degreased at a temperature of about 40° C. by mechanical stirring in a vessel containing Nap 11.

Within 30 seconds, no further trace of oil remains on the grille.

EXAMPLE 2

The process is performed as in Example 1, replacing the Nap 11 by THDCPD. The cleaning performances are identical. In 30 seconds, the grille is totally free of oil.

EXAMPLE 3
(Defluxing Test)

125 ml of THDCPD are introduced into each tank of a small laboratory twin-tank machine equipped with an ultrasound generator, and the liquid in each tank is then brought to 40° C.

Five standardized circuits (model IPC-B-25) coated with rosin-based soldering flux (flux R8F from the company Alphametal) annealed at 230° C. for 30 seconds and cooled, are immersed in the liquid at 40° C. under ultrasound for three minutes. The circuits are drained for one minute and then rinsed for three minutes in the second tank and are subsequently drained for a further minute and finally dried at 55° C.

The drying time is 75 seconds. The quality of the cleaning is evaluated by determining the level of ionic residue according to the standardized procedure IPC-TM 650 No. 2.3.25 and 2.3.26, and according to the standard MIL-STD-2000.

The value obtained, 1.52 $\mu$g eq. NaCl/cm$^2$ is very much lower than the threshold (2.5 $\mu$g.eg.NaCl/cm$^2$) which is tolerated in the electronics field.

We claim:

1. In a method comprising cleaning, degreasing or defluxing solid surfaces with a cleaning, degreasing or defluxing agent, the improvement wherein the cleaning degreasing or defluxing agent consists essentially of a mixture of cycloalkanes which has flash point above 55° C., measured according to ASTM standard D56-70, and a distillation range of from 175° C. to 235° C., and from 0 up to 0.1 parts by weight of each of a stabilizing agent and an odor masking agent based on 100 parts by weight of said mixture of cycloalkanes, said mixture of cycloalkanes being a mixture of saturated mono or polycyclic hydrocarbons, optionally substituted with one or more alkyl residues, of general formula $$C_nH_2(n+1-a) \tag{I}$$

in which n is an integer ranging from 8 to 12 and a is an integer ranging from 1 to 5.

2. A method according to claim 1, characterized in that, in the formula (I), n is an integer ranging from 9 to 11 and a is an integer ranging from 1 to 3.

3. A method according to claim 2, wherein solid surfaces comprising printed circuits.

4. A method according to claim 2, wherein solid surfaces comprising metal and/or plastic components.

5. A method according to claim 1, wherein the mixture of cycloalkanes is a mixture containing at least 40% by weight of endotetrahydrodicyclopentadiene.

6. A method according to claim 5, wherein solid surfaces comprising printed circuits.

7. A method according to claim 5, wherein solid surfaces comprising metal and/or plastic components.

8. A method according to claim 1, characterized in that the mixture of cycloalkanes is a naphthenic fraction.

9. A method according to claim 8, characterized in that the naphthenic fraction consists essentially of compounds of formula (I) in which a=1, 2 or 3 and n is between 9 and 12.

10. A method according to claim 9, wherein solid surfaces comprising printed circuits.

11. A method according to claim 9, wherein solid surfaces comprising metal and/or plastic components.

12. A method according to claim 8, wherein solid surfaces comprising printed circuits.

13. A method according to claim 8, wherein solid surfaces comprising metal and/or plastic components.

14. A method according to claim 1, wherein solid surfaces comprising printed circuits.

15. A method according to claim 1, wherein solid surfaces comprising metal and/or plastic components.

16. A method according to claim 1, wherein said cleaning, degreasing, or defluxing agent consists of said mixture, including said stabilizing and odor masking agents.

* * * * *